(12) United States Patent
Schrögmeier et al.

(10) Patent No.: US 6,388,944 B2
(45) Date of Patent: May 14, 2002

(54) MEMORY COMPONENT WITH SHORT ACCESS TIME

(75) Inventors: Peter Schrögmeier, München; Stefan Dietrich, Türkenfeld; Torsten Partsch, Resear Triangle Park; Thomas Hein, München; Patrick Heyne, München; Thilo Marx, München, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/773,221

(22) Filed: Jan. 31, 2001

(30) Foreign Application Priority Data

Jan. 31, 2000 (DE) .......................................... 100 04 109

(51) Int. Cl.$^7$ ................................................. G11C 8/00
(52) U.S. Cl. ............................. 365/233; 365/63; 365/51
(58) Field of Search ........................... 365/233, 63, 51, 365/205

(56) References Cited

U.S. PATENT DOCUMENTS

| 5,636,158 A | 6/1997 | Kato et al. |
| 5,703,815 A | 12/1997 | Kuhara et al. |
| 6,134,178 A | * 10/2000 | Yamazaki et al. .......... 365/233 |

FOREIGN PATENT DOCUMENTS

EP  0 905 701 A2  3/1999

* cited by examiner

*Primary Examiner*—Huan Hoang
(74) *Attorney, Agent, or Firm*—Herbert L. Lerner; Laurence A. Greenberg; Werner H. Stemer

(57) ABSTRACT

A memory chip with a short data access time limits the propagation time of a bit on local data line strips which are far away from output amplifiers by centering switches with respect to a center of the cell array strips, wherein the switches are junction points between local data lines and main data lines.

13 Claims, 2 Drawing Sheets

MEMORY COMPONENT WITH SHORT ACCESS TIME

BACKGROUND OF THE INVENTION

Field of the Invention

The invention relates to a memory component having a cell array with a plurality of memory cells configured such that a number of bits are synchronously accessible.

In the case of memory components which are clocked synchronously, a specific number of stored bits are to be accessed simultaneously. As a rule, the number is eight, sixteen or thirty-two bits. In this context, "simultaneously" means that all bits which are to be read synchronously have to be brought to an output of the memory component within a predefined, fixed period of time, and from the output they are transferred further as an "information packet." This period of time is typically in the range of nanoseconds.

In an electronic data processing system, such as e.g. a computer, the maximum clock frequency is limited by that unit which requires the maximum time for performing a process step. Thus, no unit is allowed to require significantly more time than the rest of the units for performing a process step. This means, inter alia, that the access time to a desired number of bits in a memory chip must not exceed the time of one clock cycle. If this were the case, then an additional clock cycle would be required until the information packet were conveyed further, since the information packet waiting at the output of the memory chip can only be conveyed further clock cycle by clock cycle. The processing units which are coupled to the memory component and require this information packet in order to perform their work would each have their work interrupted for the length of one clock cycle.

The access time required both when reading and when storing bits is thus a parameter whose value should be as small as possible.

FIG. 3 shows a schematic structure of a cell array 1 of a memory component according to the prior art. The cell array 1 includes a plurality of cell array strips 2 which are separated from one another by local data line strips 3 which are parallel to the cell array strips 2 and are adjacent on both sides. The cell array strips 2 essentially include a plurality of memory cells 7. The local data line strips 3 have a plurality of local data lines 4. The cell array 1 additionally has output amplifiers 6 to which a main data line 5 is in each case connected. This main data line 5 runs perpendicularly both to the cell array strips 2 and to the local data line strips 3.

If a specific memory cell 7 is to be accessed, then it must be activated. To that end, a plurality of word lines 11 are provided, which run parallel to the local data line strips 3 and within a specific cell array strip 2. Furthermore, a plurality of column lines 12 are provided, which run parallel to the main data lines 5 and intersect the word lines 11 at crossover points 13. Each memory cell 7 can be assigned to one of the crossover points 13 in an unambiguous manner. The activation of a crossover point 13 takes place through the activation of the corresponding word and column line 11, 12. If the crossover point 13 is activated, then the assigned memory cells 7 can be accessed.

FIG. 5 shows a schematic illustration of the path covered by a bit when it is read from a memory component or written to a memory component. Once a bit stored in a memory cell 7 has been activated via a word line 11 and a column line 12 (cf. FIG. 4) it is brought via a bit line 8 to a preamplifier 9, which is provided on a local data line 4 of a local data line strip 3 and constitutes a connecting element between the bit line 8 and the local data line 4. The bit amplified by the preamplifier then passes via the local data line 4 to a switch 10, which lies on a main data line 5 and constitutes a connecting element between the local data line 4 and the main data line 5. This switch 10 forwards the signal via the main data line 5 to an output amplifier 6, which raises the signal to a desired output level and subsequently forwards it to an output of the memory chip.

In the case of Synchronous Dynamic Random Access Memory chips (SDRAMs) which synchronously access sixteen bits, it is customary to assign in each case four memory cells 7 to a specific crossover point 13 (cf. FIG. 4). Thus, if a crossover point 13 is selected by way of the activation of the corresponding word line 11 and/or column line 12, then the associated four memory cells 7 are activated and the bits stored therein are brought via the bit line 8 to the respective preamplifiers 9, or bits to be stored are delivered via the preamplifiers 9 to the memory cells 7.

Thus, four bits are read or written through the activation of a specific crossover point 13. This means that in the event of an access to sixteen bits, precisely four crossover points 13, i.e. precisely two word lines 11 and two column lines 12, have to be activated.

In order to avoid data collisions on the bit lines and the local data lines, care must be taken, therefore, to ensure that two adjacent cell array strips 2 or two word lines 11 within the same cell array strip 2 are never activated simultaneously. This is indicated in FIG. 3 by the arrow brackets A and B, which each represent one of the possible combinations of activated cell array strips 2.

SUMMARY OF THE INVENTION

It is accordingly an object of the invention to provide a memory component which overcomes the above-mentioned disadvantages of the heretofore-known memory components of this general type and which minimizes the access time to a desired number of bits in the event of a synchronous access.

With the foregoing and other objects in view there is provided, in accordance with the invention, a memory component, including:

a cell array having a plurality of memory cells disposed in the cell array, the cell array being configured such that n bits are synchronously accessible in a synchronous memory access, n being an integer number;

a plurality of bit lines connected to respective ones of the memory cells;

a plurality of preamplifiers connected to respective ones of the bit lines;

a plurality of local data lines connected to respective ones of the preamplifiers;

a plurality of switches connected to respective ones of the local data lines;

a plurality of main data lines connected to respective ones of the switches;

a plurality of output amplifiers connected to respective ones of the main data lines; and the switches being disposed such that a longest possible propagation time of a bit in given ones of the local data lines used for the synchronous memory access is shorter, the further away from associated ones of the output amplifiers the given ones of the local data lines are relative to further ones of the local data lines which are simultaneously required for the synchronous memory access.

In other words, the object of the invention is achieved with a memory module having a plurality of memory cells disposed within a cell array, the cells are in each case connected via a bit line to a preamplifier and, from the latter, via a local data line and a main data line connected to the local data line by a switch, to an output amplifier, a number of n bits being accessed synchronously, wherein switches are disposed in such a way that the longest possible propagation time of a bit in the local data lines is shorter, the further away from the output amplifiers the local data lines are relative to the other local data lines which are simultaneously required in the event of a synchronous memory access.

In accordance with another feature of the invention, the cell array is formed of a plurality of cell array strips; and local data line strips are disposed parallel to one another and adjacent on both sides of the cell array strips such that the cell array strips are separated from one another by the local data line strips.

In accordance with yet another feature of the invention, the local data line strips include at least four of the local data lines.

In accordance with a further feature of the invention, the main data lines are disposed perpendicular to the cell array strips.

In accordance with another feature of the invention, the cell array strips define an axis which is centrally centered with respect to the cell array strips and parallel to the main data lines; and in each case two of the switches which lie on a same one of the local data line strips are disposed at a substantially identical distance from the axis.

In accordance with another feature of the invention, the cell array is configured such that eight, sixteen, thirty-two or sixty-four bits are accessed in the synchronous memory access.

In accordance with yet another feature of the invention, the plurality of output amplifiers are eight, sixteen, thirty-two or sixty-four output amplifiers.

Each bit stored in a memory cell traverses, once it has been activated, an individual path to an output amplifier assigned to the bit. This path is principally composed of a path portion covered by the bit on a local data line strip, and of a path portion covered by the bit on a main data line. This means that the individual paths of the individual bits have six different path lengths depending on the position of the memory cells, of the associated switches and thus of the associated output amplifiers. The propagation times of the individual bits from the memory cell as far as the output amplifier differ, therefore. Since, in the event of a synchronous memory access, the bits brought to an output of the memory component can only be conveyed further when all of the bits are present, the bit having the longest propagation time is crucial for the access time.

The central idea of the invention is to configure the individual paths of the individual bits in such a way as to avoid individual paths having a long propagation time. For compensation, the path length of the individual paths having a short propagation time is increased. The largely equal distribution of the number of individual paths having short, medium and long propagation times is thus redistributed into a small number of individual paths having short and long propagation times and a high number of individual paths having a medium propagation time.

A further feature of the invention is that the configuration of the individual parts is preferably implemented by way of the configuration or placement of the switches on the local data line strips which are formed of local data lines. The length of the individual path covered by the bit on the local data line strip can be varied in a targeted manner by way of the position of the switches. In this case, the placement or positioning of the switches on a local data line strip which is farthest away from the output amplifiers relative to the other local data line strips which are simultaneously required for a synchronous memory access is configured in such a way that these switches lie as far as possible in the middle of the local data line strip. This makes it possible to avoid maximal signal propagation distances and thus maximal propagation times on the local data lines since at most half a length of the local data line strip then has to be traversed.

Other features which are considered as characteristic for the invention are set forth in the appended claims.

Although the invention is illustrated and described herein as embodied in a memory component with short access time, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
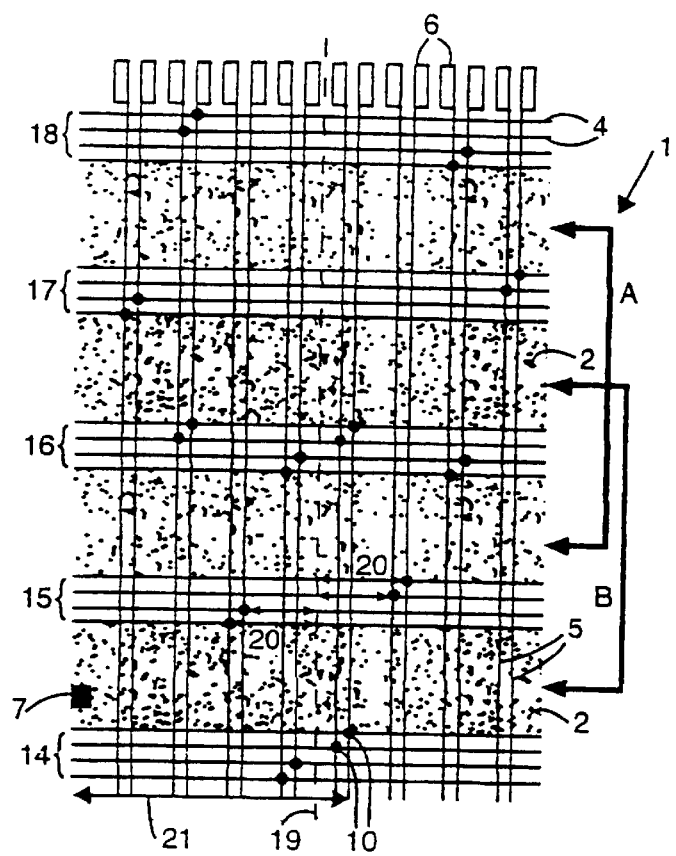
FIG. 1 is a schematic plan view of an embodiment of the memory component according to the invention.

Referring now to the figures of the drawings in detail, in which same reference symbols are used for corresponding structural parts, and first, particularly, to FIG. 1 thereof, there is shown a particularly preferred embodiment of a memory component according to the invention. This memory component is configured for a synchronous access to sixteen bits. In each case two switches 10 which lie on an identical local data line strip 14, 15, 16, 17, 18 are at an identical distance 20 from an axis 19 of the memory component. The further away from the output amplifiers 6 the local data line strips 14, 15, 16, 17, 18 are, the nearer to the axis 19 are the outer switches 10 which lie on the local data line strips 14, 15, 16, 17, 18. A V-shaped configuration structure of the switches 10 is thus produced.

This configuration structure may, for example, be repeated periodically with increasing distance from the output amplifiers 6 and can also be transferred to memory components having synchronous access to more or fewer than sixteen bits, for example thirty-two bits.

Figure 2:
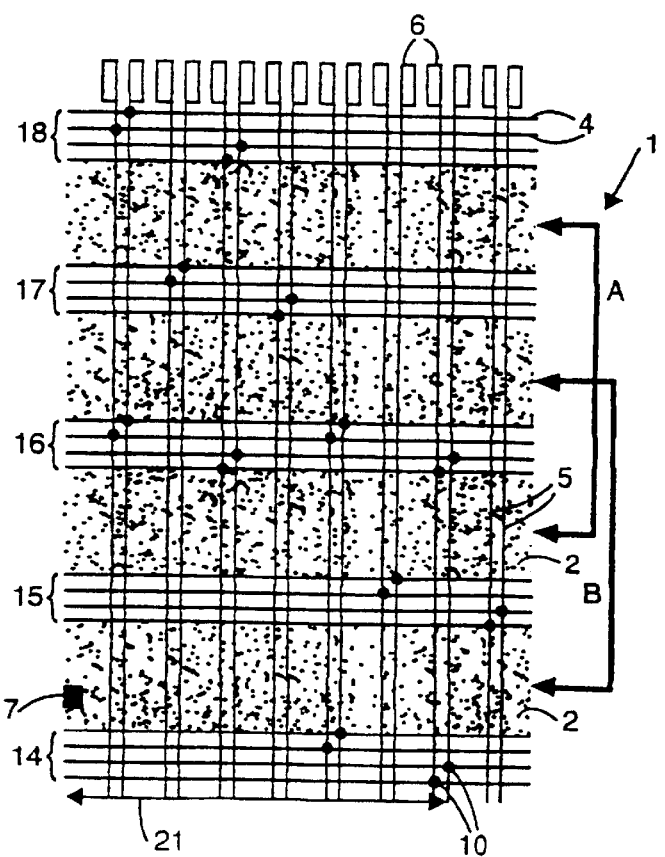
FIG. 2 is a schematic plan view of an embodiment of a memory component according to the prior art.
Figure 3:
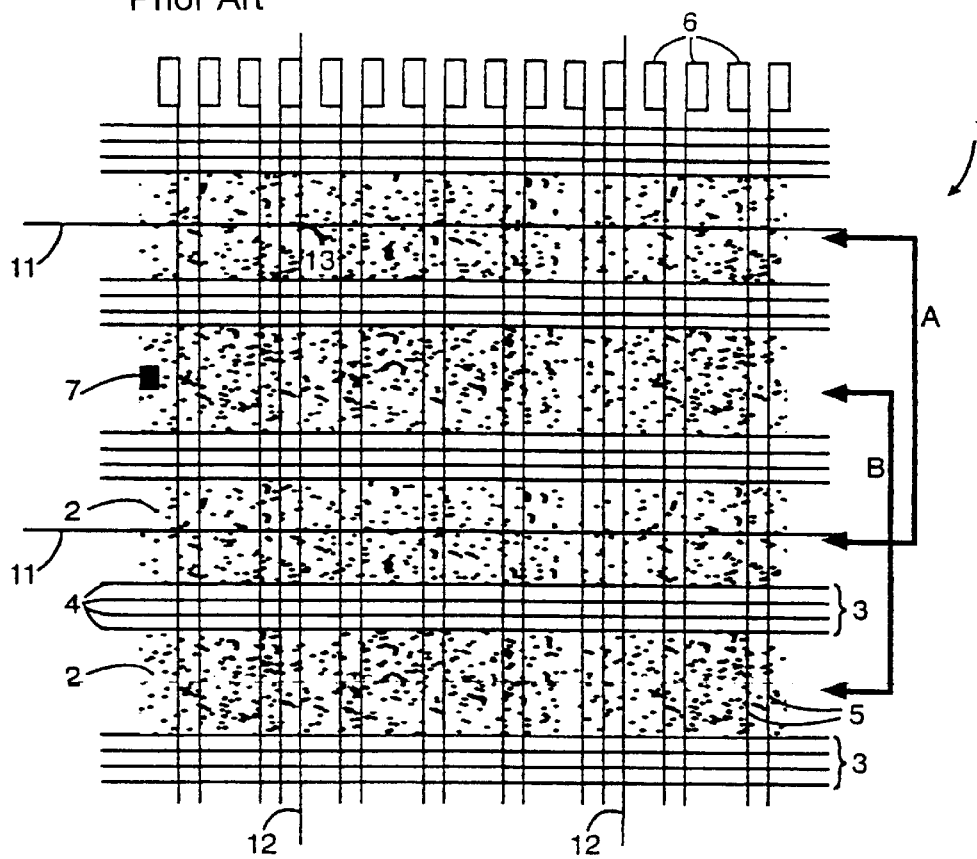
FIG. 3 is a schematic plan view of the structure of a memory component according to the prior art.
Figure 4:
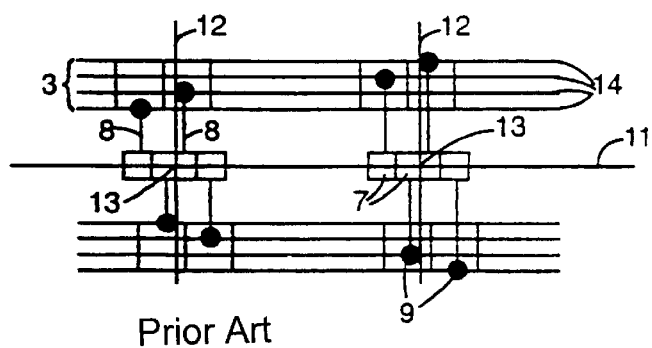
FIG. 4 is a schematic view of a detail of FIG. 3 illustrating memory cells at two crossover points.
Figure 5:
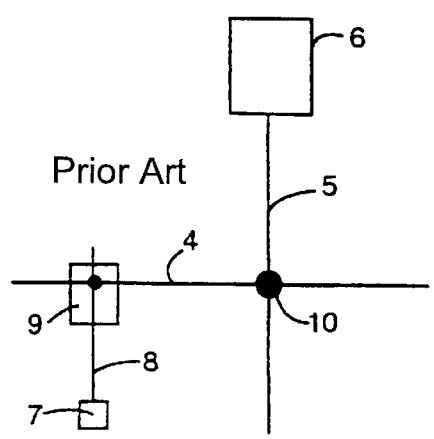
FIG. 5 is a circuit diagram illustrating a path of a bit from a memory cell to an output amplifier.

Since the switches 10 which lie on the local data line strip 14 have the longest signal propagation time with respect to the main data line 5, the maximum signal propagation distance 21 therefor must be kept as small as possible. This is achieved by the switches 10 being centered in the middle with respect to the cell array strips 2 on the local data line strips 14. Maximum signal propagation distances 21 which are longer than half the length of a local data line strip, as shown for example in FIG. 2, are thus avoided. As a result, the maximum propagation time of a bit is reduced, which makes it possible to have a higher clock rate for the memory chip.

We claim:

1. A memory component, comprising:
    a cell array having a plurality of memory cells disposed in said cell array, said cell array being configured such that n bits are synchronously accessible in a synchronous memory access, n being an integer number;
    a plurality of bit lines connected to respective ones of said memory cells;
    a plurality of preamplifiers connected to respective ones of said bit lines;
    a plurality of local data lines connected to respective ones of said preamplifiers;
    a plurality of switches connected to respective ones of said local data lines;
    a plurality of main data lines connected to respective ones of said switches;
    a plurality of output amplifiers connected to respective ones of said main data lines; and
    said switches being disposed such that a longest possible propagation time of a bit in given ones of said local data lines used for the synchronous memory access is shorter, the further away from associated ones of said output amplifiers said given ones of said local data lines are relative to further ones of said local data lines which are simultaneously required for the synchronous memory access.

2. The memory component according to claim 1, wherein:
    said cell array is formed of a plurality of cell array strips; and
    local data line strips are disposed parallel to one another and adjacent on both sides of said cell array strips such that said cell array strips are separated from one another by said local data line strips.

3. The memory component according to claim 2, wherein said local data line strips include at least four of said local data lines.

4. The memory component according to claim 2, wherein said main data lines are disposed perpendicular to said cell array strips.

5. The memory component according to claim 4, wherein:
    said cell array strips define an axis which is centrally centered with respect to said cell array strips and parallel to the main data lines; and
    in each case two of said switches which lie on a same one of said local data line strips are disposed at a substantially identical distance from the axis.

6. The memory component according to claim 1, wherein said cell array is configured such that eight bits are accessed in the synchronous memory access.

7. The memory component according to claim 6, wherein said plurality of output amplifiers are eight output amplifiers.

8. The memory component according to claim 1, wherein said cell array is configured such that sixteen bits are accessed in the synchronous memory access.

9. The memory component according to claim 8, wherein said plurality of output amplifiers are sixteen output amplifiers.

10. The memory component according to claim 1, wherein said cell array is configured such that thirty-two bits are accessed in the synchronous memory access.

11. The memory component according to claim 10, wherein said plurality of output amplifiers are thirty-two output amplifiers.

12. The memory component according to claim 1, wherein said cell array is configured such that sixty-four bits are accessed in the synchronous memory access.

13. The memory component according to claim 12, wherein said plurality of output amplifiers are sixty-four output amplifiers.

* * * * *

UNITED STATES PATENT AND TRADEMARK OFFICE
CERTIFICATE OF CORRECTION

PATENT NO. : 6,388,944 B2
DATED : May 14, 2002
INVENTOR(S) : Peter Schrögmeier et al.

It is certified that error appears in the above-identified patent and that said Letters Patent is hereby corrected as shown below:

<u>Title page,</u>
Item [75], should read as follows:
-- Peter Schrögmeier, München (DE); Stefan Dietrich, Türkenfeld (DE); Torsten Partsch, Resear Triangle Park, NC (US); Thomas Hein, München (DE); Patrick Heyne, München (DE); Thilo Marx, Villingen Schwenningen (DE) --.

Signed and Sealed this

Seventeenth Day of September, 2002

*Attest:*

*Attesting Officer*

JAMES E. ROGAN
*Director of the United States Patent and Trademark Office*